(12) United States Patent
Duong et al.

(10) Patent No.: US 9,851,945 B2
(45) Date of Patent: Dec. 26, 2017

(54) BIT REMAPPING MECHANISM TO ENHANCE LOSSY COMPRESSION IN FLOATING-POINT APPLICATIONS

(71) Applicant: Advanced Micro Devices, Inc., Sunnyvale, CA (US)

(72) Inventors: Nam Duong, Sunnyvale, CA (US); Elliot Mednick, Sunnyvale, CA (US); DongPing Zhang, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 219 days.

(21) Appl. No.: 14/623,088

(22) Filed: Feb. 16, 2015

(65) Prior Publication Data
US 2016/0239265 A1  Aug. 18, 2016

(51) Int. Cl.
*G06F 7/48* (2006.01)
*G06F 7/483* (2006.01)
*H03M 7/24* (2006.01)

(52) U.S. Cl.
CPC ............ *G06F 7/483* (2013.01); *H03M 7/24* (2013.01)

(58) Field of Classification Search
None
See application file for complete search history.

(56) References Cited

U.S. PATENT DOCUMENTS

| 5,191,548 A * | 3/1993 | Balkanski | H04N 19/42 375/E7.093 |
| 2013/0262539 A1* | 10/2013 | Wegener | G06F 7/483 708/204 |

\* cited by examiner

*Primary Examiner* — Michael D Yaary
(74) *Attorney, Agent, or Firm* — Staniford Tomita LLP

(57) ABSTRACT

Methods and systems of reducing power transmitted over a memory to cache bus having a plurality of cache lines by identifying floating point numbers transmitted over a cache line, rounding bits in least significant bit (LSB) positions of identified floating point (FP) numbers to a uniform binary value string, mapping the rounded bits from the LSB positions to most significant bit (MSB) positions of each FP number to increase a chance of matching bit patterns between pairs of the FP numbers, and compressing the floating point numbers by replacing matched bit patterns with smaller data elements using a defined data compression process. A decompressor decompresses the compressed FP numbers using a defined decompression process corresponding to the defined compression process; and the mapping component applies a reverse mapping function to map the rounded bits back to original LSB positions from the MSB positions to recover the original floating point numbers.

20 Claims, 4 Drawing Sheets

402

404

BIT REMAPPING MECHANISM TO ENHANCE LOSSY COMPRESSION IN FLOATING-POINT APPLICATIONS

TECHNICAL FIELD

Embodiments relate generally to microprocessor and memory operations, and more specifically to improving floating-point applications by enhanced compression techniques.

BACKGROUND

The inherently high parallelism of modern processors, such as GPUs (graphical processing units) has led to a significant increase in power dissipation, thereby necessitating expensive cooling solutions. In addition, general purpose processing on such specialized architectures poses new problems yet opens avenues for power optimizations at the architectural level. Data compression is a promising technique to decrease on-chip and off-chip bandwidth usage and reduce power dissipation. If the amount of data being driven onto busses can be reduced, it can translate into a proportionate savings in power. A significant portion of system power is used to drive data on cache and memory busses. These busses transfer cache line data between adjacent levels of the memory hierarchy. Each of these transactions requires multiple cycles to complete a transfer, each cycle consuming power and taking time. By compressing data, the smaller data size can result in a shorter transaction, and therefore less power is needed to transmit the data.

Memory busses can benefit significantly from data compression because they are off-chip busses that consume more power per transfer cycle than on-chip busses. Because memory transfers have a relatively high latency, the latencies in the act of compressing and decompressing data in hardware are more easily hidden. Data compression for software is generally designed to be implemented in software and to compress long streams of data because it relies on matching patterns to previously-seen or known patterns. Of significant interest, however, are compression techniques that can compress relatively small units of data, such as a 64-byte cache line, and can be implemented in hardware with low-latency and low power overhead. For example, there have been a number of studies on the compressibility of cache and memory data, for the purpose of increasing memory utilization. Such compression techniques could be used instead of, or in addition to, reducing the size of bus transactions specifically to reduce power.

Many applications use floating point numbers, which themselves are typically not easily compressed due to the random distribution of common patterns. Lossy compression techniques have been used to reduce the size of datasets in such floating point applications. One popular mechanism that is presently known is to round the least significant bits (LSBs) of the mantissa to zeros. Such compression techniques are usually acceptable since the LSBs of floating point numbers in most applications are not particularly useful as such high precision is not often needed. However, existing compression algorithms are not designed to match the LSBs among different floating point numbers. As a result, the compression algorithm must be modified to be aware of these rounded bits or be aware of the odd alignments of bits. The modifications, however, can impact overall compressibility, because the compression algorithm has to be aware of more patterns.

What is desired, therefore, is a mechanism that is adaptive to rounded bits in a compression process and that exposes more matching patterns in order to improve the compressibility of floating point numbers.

What is further desired is a mechanism of improving the compression ratio of floating point numbers to reduce power consumption in cache lines and cache compression hardware.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches. For example, embodiments may be directed to applications related to bus compression, however described bit mapping methods can be used for any lossy compression method in hardware design. Some examples include bus, cache, and memory, and such a method can be used to save energy, or to reduce the size of cache lines or memory blocks.

SUMMARY OF EMBODIMENTS

Embodiments are directed to a method for processing floating point numbers by detecting floating point (FP) numbers in a dataset, rounding bits in least significant bit (LSB) positions of each detected FP number to a set binary value, and mapping the rounded bits from the LSB positions to most significant bit (MSB) positions of each detected FP number to increase a chance of matching bit patterns between pairs of detected FP numbers. The method further comprising compressing the detected FP numbers using a defined compression process, decompressing the compressed FP numbers using a defined decompression process corresponding to the defined compression process and applying a reverse mapping function to map the rounded bits back to original LSB positions from the MSB positions. The set binary value may be zero, in which case the LSB bits are rounded down; or the set binary value may be one, in which case LSB bits are rounded up. In an embodiment, the mapping comprises one of a shift function and a hashing function. The defined compression process may be one of: Frequent-Pattern Compression, X-match, X-RL, C-Pack, SSDPMC2, SSDPMC2+33, and MPack compression. In an embodiment, the dataset is transmitted over a cache line to one of an L1 or L2 cache. The mapping is generally configured and intended to reduce power consumption requirements of transmitting the dataset over the cache line.

Embodiments are also directed to a method of reducing power transmitted over a memory to cache bus having a plurality of cache lines by rounding bits in least significant bit (LSB) positions of floating point (FP) numbers to a uniform binary value string, mapping the rounded bits from the LSB positions to most significant bit (MSB) positions of each FP number to increase a chance of matching bit patterns between pairs of the FP numbers, and compressing the floating point numbers by replacing matched bit patterns with smaller data elements using a defined data compression process. The method further comprises decompressing the compressed FP numbers using a defined decompression process corresponding to the defined compression process, and applying a reverse mapping function to map the rounded bits back to original LSB positions from the MSB positions. The uniform binary value string may be one of a sequence of zeros or a sequence of ones. The method further comprises identifying the floating point numbers within a variety of data types transmitted over the memory to cache bus, wherein the identifying comprises one of: using knowledge of a defined format of floating point numbers to identify the floating point numbers amont the variety of data types, and recognizing a datatype identifier associated with the floating point numbers.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Figure 1:
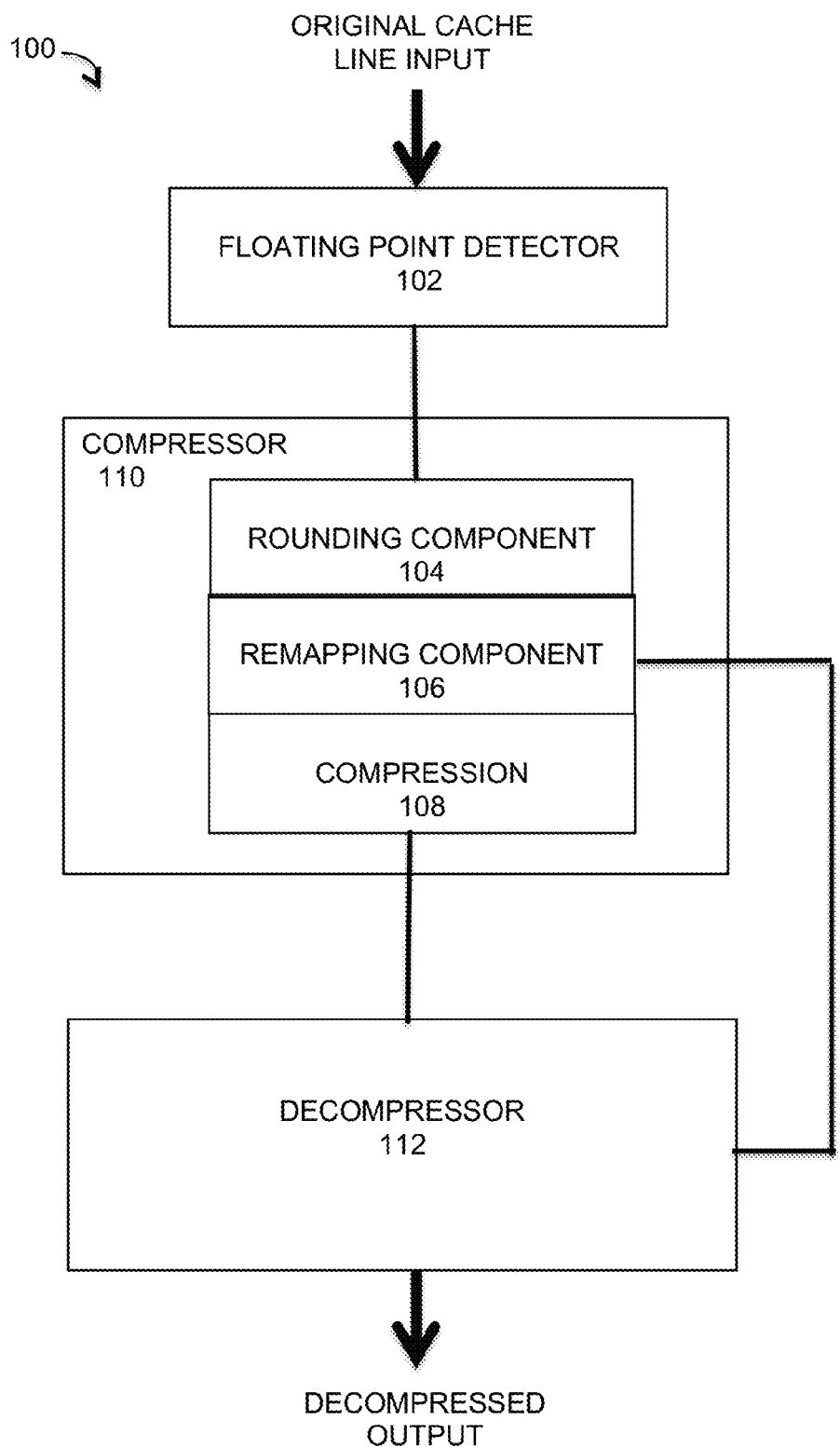
FIG. 1 illustrates a data compression system including a bit-remapping component under some embodiments.

Lossy compression is a common technique to compress datasets in floating point applications by rounding the least significant bits of the mantissa to zero. Existing compression algorithms require modification to accommodate rounded bits or odd alignments of bits, requiring awareness of more patterns, which can negatively impact compressibility. Embodiments are directed to systems and methods that improve compression in floating point applications by moving the rounded bits to the most significant positions to expose more patterns that can be compressed. A bit-remapping (or hashing mechanism) reorders the bits of the mantissa to expose more matching patterns for lossy compression, thus increasing the compression ratio of the data flow in floating point applications.

Floating-point (FP) applications operate on floating point numbers, which are binary numbers carried out to a specific number of digits, and containing a decimal point (radix) in the digit sequence. Such numbers are typically stored in three parts: the sign (plus or minus), the mantissa (sequence of meaningful digits), and the exponent, which determines the position in the mantissa where the radix point is placed. A floating point number as used in a hardware design is typically presented in IEEE-754 format, which consists of the sign bit, the exponent and the mantissa. Floating point operations are usually performed in a floating point unit (FPU), also known as a math coprocessor or numeric coprocessor, that manipulates numbers more quickly than the basic microprocessor circuitry. FPUs generally use instructions that solely involve large mathematical operations, and may be specialized or configured to deal only with simpler floating-point operations (e.g., addition and multiplication) or more complicated operations (e.g., division).

It has been shown that data patterns inside cache and memory are not random and not uniformly distributed. For example, long strings of zeros, small zero- and sign-extended integers, and floating point numbers with similar exponents and mantissas are common. These present opportunities for good compression. The interface between the last-level cache (LLC) and memory is a high-speed, off-chip bus that consumes a significant amount of energy for every data transfer transaction. Memory transactions are almost always in the form of last-level cache line transfers. In most systems, the size of the LLC line is larger than the width of the memory bus. For example, in a certain process, the LLC line size is 64 bytes and the smallest amount of data that can be transferred from the high-bandwidth memory (HMB) DRAM is 32 bytes, therefore, a bus transaction requires two cycles to complete a full line transfer. In other systems, the bus may be as small as 4 bytes, requiring 16 cycles. One way to reduce power on the memory bus is to reduce the number of transfers by compressing the data. Though much application of data compression has been for resource savings, such as reducing memory and cache transfer times, only recently has the focus been on reducing power. Embodiments are directed to mechanisms (systems and/or methods) of implementing and applying compression schemes floating point applications for the purpose of reducing the number of memory bus transactions in which every reduction in the number of data transfers corresponds to a power reduction.

FIG. 1 illustrates a data compression system including a bit-remapping component under some embodiments. FIG. 1 illustrates an example system that processes data between main memory and cache memory (i.e., L1 or L2 caches), and thus may represent a portion of a cache compression hardware circuit, though embodiments are not so limited. The cache-memory interface is typically implemented in a higher power bus, so much power can potentially be saved by compressing data sent over these bus lines. The data processing system of FIG. 1 includes a compressor stage 110 and a decompressor stage 112 that work together to compress data appearing on cache lines and then decompress or restore the original data.

Figure 2:
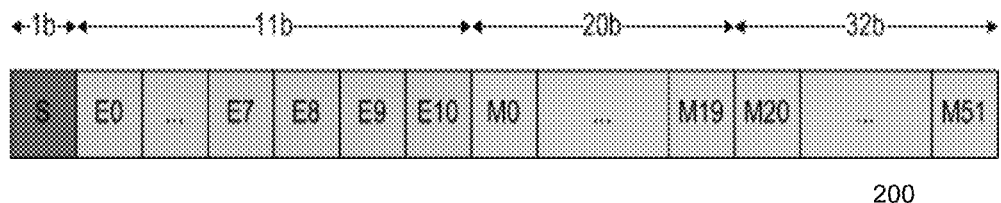
FIG. 2 illustrates a defined floating point number format that may be used by a floating point detector in a data compression system, under some embodiments.

For the embodiment of FIG. 1, system 100 includes a floating point number detector 102 that identifies floating point numbers in the input data to facilitate optimal compression of floating point numbers. This component 102 detects floating point numbers in a cache line based on one or more recognition processes. In an embodiment, the detector 102 uses knowledge of the defined format of floating point numbers to determine the presence a floating point number in the cache line. For example, the format of a single- and double-precision numbers is defined by the widely used IEEE-754 floating point representation. FIG. 2 illustrates the IEEE-754 floating point format that may be used by the floating point detector 102, under an embodiment. As shown in FIG. 1, S is the sign bit, E0 is the most significant bit (MSB) of the exponent, E10 is the least significant bit (LSB) of the exponent, M0 is the MSB of the significand (also called the mantissa), and M51 is the LSB of the significand. The system is configured to know that if a floating point value is present in a cache line, double-precision values are aligned on 64-bit boundaries, and single-precision values are aligned on 32-bit boundaries. Without knowing with certainty whether any particular 32- or 64-bit value within a line is a floating point number, the detector 102 can generate value histograms and compare cache lines from benchmark data to find if there is a disproportionate number of certain data patterns (e.g., values containing 0x400 and 0xC00) in the most-significant bits of a 64-bit aligned window compared to a certain benchmark. Although this does not guarantee that every 64-bit datum that starts with these values is a floating point number, for the purposes of detecting this pattern for a compression optimization, this approach is relatively advantageous.

In an alternative embodiment for floating point number detection, floating point numbers may be tagged with a datatype tag to identify a number datum as a floating point number as opposed to a non-floating point number. In this case, the detector 102 would be configured to recognize the appropriate datatype tag to identify a particular number as a floating point number. In a further alternative embodiment, the detector 102 can be configured to guess that a particular number is a floating point number based on certain defined data patterns or through a learning process that utilizes pattern recognition based on historical data.

Floating point numbers that are detected by detector 102 are processed by compressor 110. In an embodiment, the compressor 110 includes certain sub-components, such as a rounding component 104, a bit-remapping component 106, in addition to the compression component 108. The rounding component 104 rounds down the LSBs of the floating point number mantissa to zeros. Thus, for example, if the original floating point numbers in a cache line (denoted A1 and A2) are given as:

A1=0x3ff0_1234_5678_90ab|A2=0x3de1_6543_9999_aaaa

Rounding 12 LSBs of the mantissas to zeros yields the rounded FP numbers (denoted A1' and A2') as:

A1'=0x3ff0_1234_5678_9000|A2'=0x3de1_6543_9999_a000

The rounded FP numbers are then processed by bit re-mapping component 106, which moves the rounded LSB bits to the most significant bit positions, so that the newly created sequence(s) of zeros in each number is moved to the MSB portion of the number. Thus, continuing with the above example, the re-mapping component would reconfigure the FP number bit sequence to generate re-mapped numbers (denoted A1" and A2") as follows:

A1"=0x0003_ff01_2345_6789|A2"=0x0003_de16_5439_999a

The re-mapping component 106 thus moves the rounded bits to the MSB positions of both numbers so that the new numbers A1" and A2" now have the first 16 bits matching, which allows the compression component or algorithm 108 to easily identify and compress this pattern. Thus, the compression component 108 would compress the bit sequence: 0x0003.

The compression component 108 may implement any appropriate compression algorithm or process to compress the matching patterns of floating point numbers processed by the rounding and remapping components 104 and 106. Such compression methods may include traditional compression methods, such as Frequent-Pattern Compression, X-match and X-RL, and C-Pack; and newer compression methods, such as SSDPMC2, SSDPMC2+33, and MPack. X-Match is a relatively early compression scheme that was developed explicitly to compress memory data for datasets involving relatively small amounts of data, such as the size of pages that are on the order of kilobytes. It uses a dictionary to store seen data, looks for matches to new data, and replaces matched data by a reference to the pattern. X-RL is a slight improvement on X-Match that adds run-length (RL) encoding of consecutive words that contain only zeros. Frequent Pattern Compression (FPC) uses only the information within a 32-bit word to determine the compression, instead of a dictionary. FPC assumes that certain patterns, such as small integers and all zeros, appear in memory data more frequently than others, and looks at one 32-bit word at a time and applies one of seven compression schemes using a three-bit code to the compressed data to indicate which scheme it applied. The Cache Packer (C-Pack) algorithm uses a combination of static compression and dictionary lookup. In C-Pack, a 32-bit word is tested against some simple patterns including patterns that are already in the dictionary, and a word can be compressed if a dictionary entry contains even a partial match. The newer compression schemes include SSDPMC2 (Statically-Seeded Directory Partial Match Compression 2), which looks at 32-bit words and encodes them per a defined format, and uses a dictionary with eight 32-bit entries to store potentially reused data words. Another compression scheme is the MPack compression algorithm, which was designed for low-latency decompression for compressed cache data and mitigates some of the drawbacks of previous compression mechanisms regarding the need for non-trivial variable length decoding to decompress each successive word. The MPack algorithm uses fixed-size 4-bit symbols for each of the 16 words in the uncompressed cache line. It should be noted that MPack was initially developed for the L3 cache and has been used in bus compression, among other applications.

Figure 3:
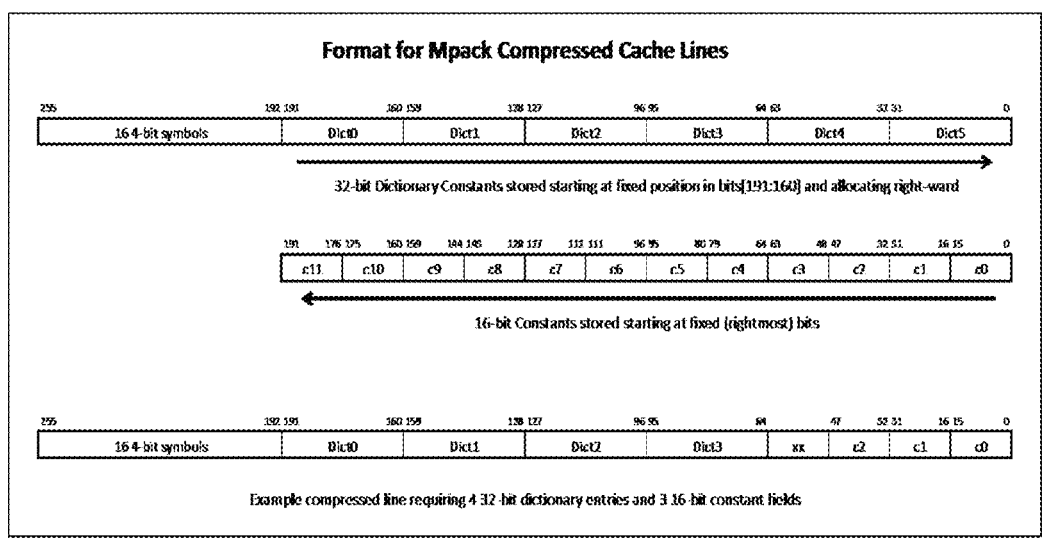
FIG. 3 illustrates an example format of a compressed data set using an MPack compression method, under an embodiment.

In an embodiment, the compression component implements the MPack compression algorithm, which is a relatively more efficient compression algorithm for cache lines as compared to other compression methods, although embodiments are not so limited. The MPack algorithm, when successful at compressing a 64 bit line to 32 bits or less, creates a 32 bit line that is formatted according to a defined format, such as shown in FIG. 3. The 4-bit symbols of this format may be encoded in any appropriate or defined manner.

The compressed data is then transmitted to a decompressor stage 112 where a decompression process corresponding to the compression algorithm is applied. After the bits are decompressed, the rounded bits are moved back to the original positions and the original numbers are recovered. The moving back of the rounded bits is accomplished by applying the inverse mapping process applied by the re-mapping component 106. The decompressor 112 then outputs the original rounded numbers. The rounding process generally produces some degree of loss, however in most applications, the rounding loss is tolerable or acceptable compared to the performance and/or power savings gained by the improved compression ratio (i.e., the size of the compressed data divided by the size of the uncompressed data) provided by the rounding and remapping components.

Although embodiments have been described in which the rounding component 104 rounds the LSBs of floating numbers to zeros, it should be noted that this component could also be configured to round the LSBs up to ones, in which case the remapping component and compression component would operate on data strings comprising sequences of ones (e.g., x1113).

Figure 4:
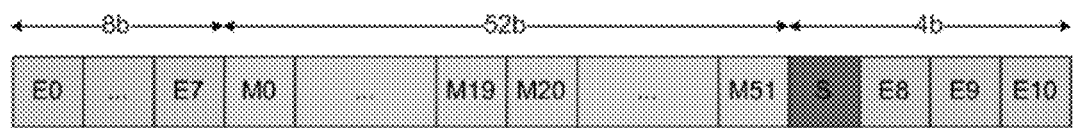
FIG. 4 illustrates two different hash functions that can be used in the re-mapping component, under an embodiment.
Figure 4:
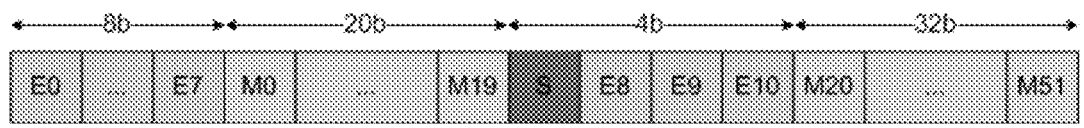

The remapping component 106 can use one of a number of mechanisms to shift or rearrange the bits within a data word. For example, a shift register circuit may be used to shift the rounded bits from the LSB positions to the MSB positions. In an alternative embodiment, a hashing function is used to rearrange the bits. A general hashing function can be used to rearrange bits for better alignment depending on the compression algorithm 108 that is used. For example, the MPack algorithm performs pattern matching along byte and word boundaries. The exponent and mantissa fields of floating point numbers are often not conveniently aligned on such boundaries. The remapping component rearranges the format to group bits that are less likely to change and align the groups at more convenient word boundaries, thus producing higher rates of matching patterns. FIG. 4 illustrates two different hash functions that can be used in the remapping component 106. The first hash function 402 moves the sign bit and the three exponent LSBs, which are expected to change more frequently, to the rightmost portion of the number and shifts all of the other bits to the left. The second hash function 404 moves the sign bit and three exponent LSBs to the rightmost position of the upper 32-bit word, and shift the 32 LSBs of the significand to the right so that they completely occupy the lower 32-bit word. With the use of the rounding component 104, the bits shifted through either hashing function 402 or 404 will generally be set to zero.

As stated above, system 100 may be implemented as a dedicated hardware circuit or a part of a special purpose cache compression system. Alternatively, the compression optimizing functions of the circuit may be implemented as process steps performed or executed by a processor executing program instructions, such as a CPU or special purpose processing unit, such as an application specific integrated circuit (ASIC), co-processor, programmable logic device (PLD), and the like.

Figure 5:
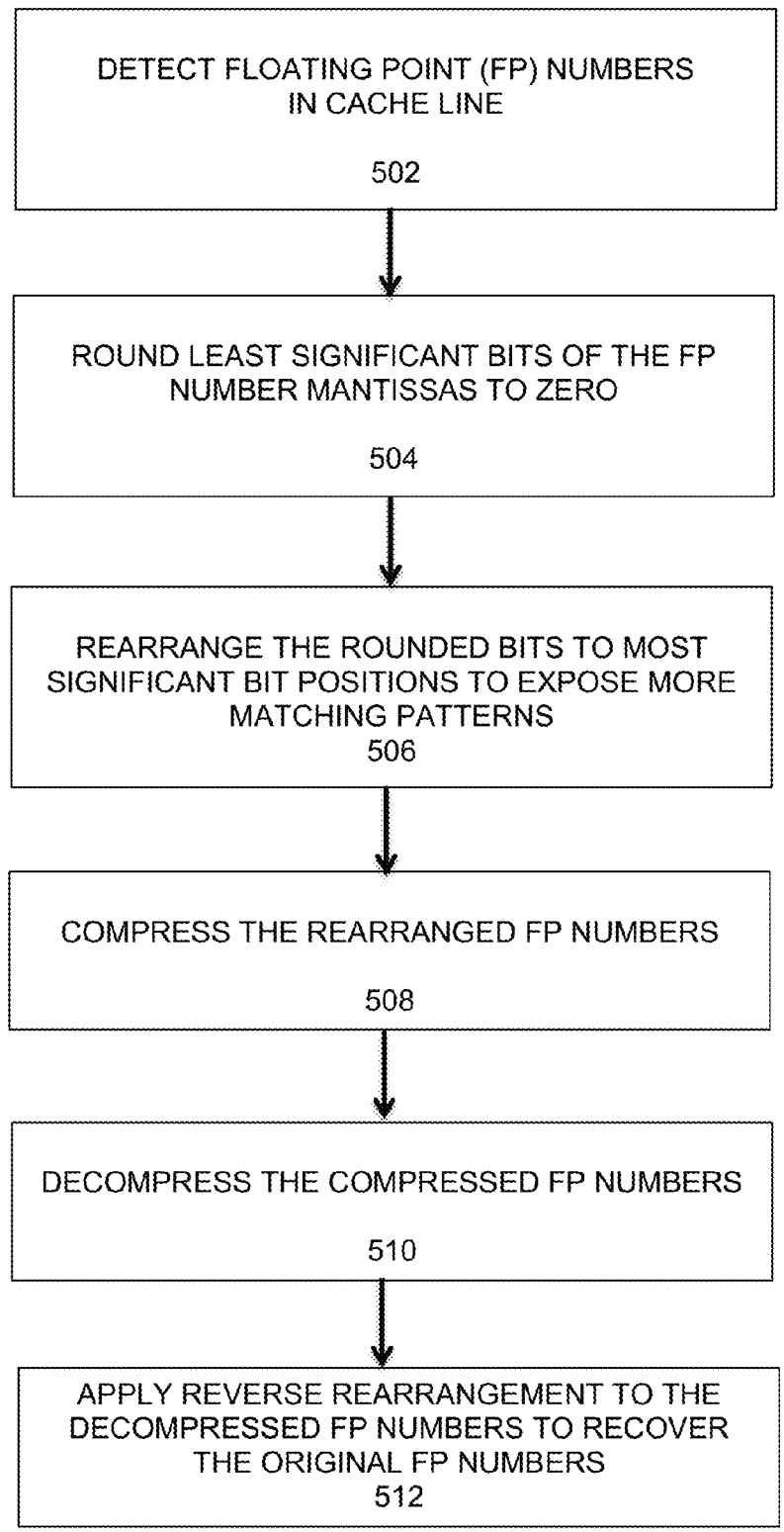
FIG. 5 is a flowchart that illustrates a method of compressing floating point numbers using a bit re-mapping process, under an embodiment.

FIG. 5 is a flowchart that illustrates a method of compressing floating point numbers using a bit re-mapping process, under an embodiment. The process of FIG. 5 begins with the detection of floating point numbers in a cache line, 502. The least significant bits of the identified floating point numbers are then rounded to zero (in the case of rounding down) or one (in the case of rounding up), 504. The rounded bits are then re-mapped or re-arranged, such as through a shift or hash function, from the LSB position to the MSB position to expose more matching patterns among the floating point numbers, 506. The process then performs a compression operation on the re-arranged numbers, 508. Any appropriate compression algorithm (e.g., MPack or CPack, etc.) may be used. Depending on the increased number of matching patterns created or exposed by the re-mapping process, the compression ratio should be improved by this process. The compressed numbers are then transmitted and decompressed, 510, by applying the appropriate decompression process based on the compression algorithm. The decompressed numbers are then subject to a inverse mapping operation to shift the re-mapped bits back in their original order, 512. One or more of the process steps of FIG. 5 may be performed by corresponding components of FIG. 1, or by other similarly configured and capable hardware components or circuitry.

Embodiments can be used either throughout an entire floating point application, or only used on specific variables, or for chosen components of an application. For variable levels, the underlying algorithms implemented in an application and its input data range may have a dominating impact on what range the intermediate values of the floating point variables will belong to. The heuristic and preliminary runs of the application at fewer steps can be used to derive the best suitable number of rounding bits and the hashing (re-mapping) scheme. A more dynamic scheme can also be designed to learn the range of the variables during runtime and revise the compression scheme. Furthermore, embodiments can also be used in integer type of data for lossy compression, in either integer applications or mixed floating point and integer applications.

Any of the embodiments described herein may be used alone or together with one another in any combination. The one or more implementations encompassed within this specification may also include embodiments that are only partially mentioned or alluded to or are not mentioned or alluded to at all in this description or in the abstract. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

Embodiments are generally directed to processing floating point numbers in floating point applications. Such applications may be performed or implemented in discrete floating point units (FPUs), or in functionality that is integrated other processors, such as CPUs or graphic processors (GPUs) and the like. FPU functionality may be implemented as hardware circuits or software processes, or both. For example, simple operations may be implemented in hardware or microcode, while the more complex FPU operations may be implemented as software.

Embodiments are also directed to microprocessor based application and implementation. In an example implementation, a CPU utilizing the compression system described herein may have different configurations and different resulting performance/power consumption improvements. For example a processor may have an L2 cache line size of 64 bytes, and a memory bus width of 32 bytes. Thus, every cache line read or write transaction requires two data cycles. If the line data can be compressed by a factor of two before the transaction, then those two cycles can be reduced to one, saving power and potentially improving performance. This assumes that the power required to compress and decompress the data is less than the power savings. In other architectures, the size difference between the LLC cache size and the memory bus may require more data cycles per transaction. Other compression schemes may reduce 64-byte data by factors of 4 and 8 or similar factors.

For purposes of the present description, the terms "component," "module," "circuit," and "process," may be used interchangeably to refer to a circuit element or processing unit that performs a particular function. Such a function may be implemented purely in hardware or it may be implemented through computer program code (software), digital or analog circuitry, computer firmware, or any combination thereof.

It should be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media. Under some embodiments, the computer readable media may store program code or software instructions that are executed by a computer system and cause the computer system to perform at least some of the functions and processes of a method described herein.

Some embodiments are also directed to computer readable media comprising a data structure that is operated upon by a program executable on a computer system. The program operates on the data structure to perform a portion of a process to fabricate an integrated circuit including circuitry described by the data structure. The circuitry described in the data structure includes providing a method of mapping virtual memory pages to physical memory pages based on assumed or determined or predicted contiguity of the virtual memory pages to improve the locality of physical memory accesses.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for processing floating point numbers, comprising:
    detecting floating point (FP) numbers in a dataset;
    rounding bits in least significant bit (LSB) positions of each detected FP number to a set binary value; and
    mapping the rounded bits from the LSB positions to most significant bit (MSB) positions of each detected FP number to expose a higher number of matching bit patterns between pairs of detected FP numbers to thereby increase compression ratio of data flow in FP applications.

2. The method of claim 1 further comprising determining specific floating point numbers in the dataset to which to apply the rounding and mapping based on a dynamic process that derives a number of rounding bits through a runtime revision scheme for a specific FP application of the FP applications.

3. The method of claim 1 further comprising:
    compressing the detected FP numbers using a defined compression process;
    decompressing the compressed FP numbers using a defined decompression process corresponding to the defined compression process; and
    applying a reverse mapping function to map the rounded bits back to original LSB positions from the MSB positions.

4. The method of claim 1 wherein the set binary value is zero and the LSB bits are rounded down.

5. The method of claim 1 wherein the set binary value is one and the LSB bits are rounded up.

6. The method of claim 1 wherein the mapping comprises at least one shift function and at least one hashing function.

7. The method of claim 3 wherein the defined compression process is selected from the group consisting of: Frequent-Pattern Compression, X-match, X-RL, C-Pack, SSDPMC2, SSDPMC2+33, and MPack compression.

8. The method of claim 1 wherein the dataset is transmitted over a cache line to one of an L1 or L2 cache.

9. The method of claim 8 wherein the defined compression process comprises MPack compression, and wherein the mapping is configured to reduce power consumption requirements of transmitting the dataset over the cache line.

10. The method of claim 1 wherein the detecting comprises one of: using knowledge of a defined format of floating point numbers to determine the presence the floating point number, and recognizing a datatype identifier associated with the floating point number.

11. The method of claim 8 wherein the detecting further comprises generating value histograms and comparing cache lines from benchmark data to determine if there is a disproportionate number of certain data patterns in the most-significant bits of a 64-bit aligned window compared to a defined benchmark.

12. A method of reducing power transmitted over a memory to cache bus having a plurality of cache lines, the method comprising;
    rounding bits in least significant bit (LSB) positions of floating point (FP) numbers to a uniform binary value string;
    mapping the rounded bits from the LSB positions to most significant bit (MSB) positions of each FP number to expose a higher number of matching bit patterns between pairs of detected FP numbers to thereby increase compression ratios; and
    compressing the floating point numbers by replacing matched bit patterns with smaller data elements using a defined data compression process.

13. The method of claim 12 further comprising:
    decompressing the compressed FP numbers using a defined decompression process corresponding to the defined compression process; and
    applying a reverse mapping function to map the rounded bits back to original LSB positions from the MSB positions.

14. The method of claim 13 further comprising determining specific floating point numbers in the dataset to which to apply the rounding and mapping based on a dynamic process that derives a number of rounding bits through a runtime revision scheme for the defined compression process.

15. The method of claim 12 further comprising identifying the floating point numbers within a variety of data types transmitted over the memory to cache bus, wherein the identifying comprises one of: using knowledge of a defined format of floating point numbers to identify the floating point numbers among the variety of data types, and recognizing a datatype identifier associated with the floating point numbers.

16. An apparatus for of reducing power transmitted over a memory to cache bus having a plurality of cache lines, comprising:
    a detection component detecting floating point (FP) numbers in a dataset transmitted over a cache line of the plurality of cache lines;
    a rounding component rounding bits in least significant bit (LSB) positions of each detected FP number to a set binary value; and
    a mapping component mapping the rounded bits from the LSB positions to most significant bit (MSB) positions of each detected FP number to expose a higher number of matching bit patterns between pairs of detected FP numbers to thereby increase compression ratio of data flow in FP applications.

17. The apparatus of claim 16 further comprising:
    a compressor compressing the detected FP numbers using a defined compression process, a decompressor decompressing the compressed FP numbers using a defined decompression process corresponding to the defined compression process; and the mapping component applying a reverse mapping function to map the rounded bits back to original LSB positions from the MSB positions.

18. The apparatus of claim 17 further comprising a component determining specific floating point numbers in the dataset to which to apply the rounding and mapping based on a dynamic process that derives a number of rounding bits through a runtime revision scheme for a specific FP application of the FP applications.

19. The apparatus of claim 16 wherein the dataset is transmitted over the cache line to one of an L1 or L2 cache, and wherein the detection component further generates value histograms and compares cache lines from benchmark data to determine if there is a disproportionate number of certain data patterns in the most-significant bits of a 64-bit aligned window compared to a defined benchmark.

20. The apparatus of claim 19 wherein the mapping is configured to reduce power consumption requirements of transmitting the dataset over the cache line.

\* \* \* \* \*